United States Patent [19]
Mou et al.

[11] Patent Number: 5,969,647
[45] Date of Patent: Oct. 19, 1999

[54] METHOD OF COMPRESSING LETTERS IN A CALLER IDENTIFICATION CODE SYSTEM

[75] Inventors: Michael Mou; Yung-Cheng Lai, both of Tu-Cheng, Taiwan

[73] Assignee: DBTEL Incorporated, Taipei Hsien, Taiwan

[21] Appl. No.: 09/076,824

[22] Filed: May 13, 1998

[51] Int. Cl.[6] ........................................ H03M 7/00
[52] U.S. Cl. ............................... 341/55; 340/825.44
[58] Field of Search ............................. 341/50, 55, 106, 341/56, 107; 340/825.44, 825.6, 825.62

[56] References Cited

U.S. PATENT DOCUMENTS 5,095,307  3/1992  Shimura et al. ................. 340/825.44
5,546,077  8/1996  Lipp et al. ....................... 340/825.44
5,659,755  8/1997  Strohacker ....................... 364/715.04
5,684,478  11/1997 Panaoussis ............................ 341/51

*Primary Examiner*—Marc S. Hoff
*Assistant Examiner*—Peguy JeanPierre
*Attorney, Agent, or Firm*—Rosenberg, Klein & Bilker

[57] ABSTRACT

A method of compressing letters adapted to store a letter in a specific bit and a memory unit includes compiling a set of 26 letters of the English alphabet and dividing it into two halves, which are respectively encoded as headers or tailers. Headers are stored in the specific bit, while tailers are stored in the memory unit, so as to reduce memory spaces. By using the method in combination with a specially designed data structure, 16 letters may be stored in 10 bits.

6 Claims, 2 Drawing Sheets

| 10:30 | 11 | 20 | 21 | 22 | 23 | 24 | 25 | 26 | 27 | 28 | 29 | 2A | 2B | 2C | 2D | 2E | 00 | 00 |
|---|---|---|---|---|---|---|---|---|---|---|---|---|---|---|---|---|---|---|
| 10:30 | 11/ | 20 | A | B | C | D | E | F | G | H | I | J | K | L | M | N | | |

11: TIME  12: DATE  13: NAME

PRIOR ART

*FIG.1*

METHOD OF COMPRESSING LETTERS IN A CALLER IDENTIFICATION CODE SYSTEM

BACKGROUND OF THE INVENTION

1. Field of the Invention

The present invention relates to a method of compressing letters, and more particularly to a method of compressing letters in a caller identification code system.

2. Description of the Prior Art

Due to market demands, telephone sets having caller identification code systems are becoming increasingly popular. A caller identification code generally includes the name or code of the caller, the time, the date, etc. When a call is coming in, the user may know in advance who is calling so that he/she may decide whether or not to answer the call. Such caller identification code systems certainly have positive effects.

Since the number of letters of the name of a person is generally within sixteen, and since ASCII utilizes codes of 8 bits for compiling codes representing 256 different signs in which the capital letters of the English alphabet are from 21H to 3AH of the hexadecimal number system, the memory unit for storing names included in the caller identification code systems are designed to be 16 bytes, which, however, requires improvement.

Referring to FIG. 1, in a telephone set having a caller identification code system, the data structure of the conventional caller identification code system is divided into three parts. The first part, referenced by the numeral 11, contains two bytes and is sued for storing time data. For instance, if a call comes at 10:30, then the time data stored will be "1030". The second part 12 also contains 2 bytes and is used to store date data. For instance, if it is November 20, then the data stored will be "1120". The third part 13 contains 16 bytes and is used to store the name codes of callers. For instance, if the name of the caller is "AB . . . N", then the data stored will be 21, 22,2E of the hexadecimal number system. The first and second parts employ the BCD codes, whereas the third part adopts the ASCII codes.

As a matter fact, since there are only 26 letters in the English alphabet and the name codes may simply consist of capital letters, 5 bits will be enough for encoding. It is not necessary to use 8 bits. But the address of memories generally has bytes as their units. In order to save memory space, every 5 bits is a unit. Storing five-digit-encoded data "one be one" in a memory whose unit of address is 8 bits (equivalent to 1 byte) makes it very complicated in data reading and writing as well as data processing.

SUMMARY OF THE INVENTION

The present invention relates to a method of compressing letters, and more particularly to a method of compressing letters in a caller identification code system.

A primary object of the present invention is to provide a method of compressing letters in a caller identification code system, in which equivalent 5-bit compilation of the 26 letters of the English alphabet is used to effectively reduce memory spaces so that a relatively small memory space may store more caller identification codes.

According to an aspect of the present invention, the method is adapted to store a letter which is included in a sign set and comprises the steps of setting a specific bit and setting the value of a memory unit as the order of the letter exceeding the mean value of the sign set when the order of the letter exceeds a mean value of the sign set; and resetting the specific bit and setting the value of the memory unit as the order of the letter when the order of the letter does not exceed the mean value of the sign set. The value of the memory unit is determined by the number of half of the letters in the sign set. The sign set includes {A, B . . . Y,Z} spaces and 26 letters, and the mean value of the sign set is {M}, that which of the order of the letter not exceeding the mean value of the sign set being {A,B . . . , M}, and that which of the order of the letter exceeding the mean value of the sign set being {N,O, . . . , Z}.

According to the method of the present invention, the order of the letter is from 0 of {A}, 1 of {B}, . . . , to 25 of {Z}, and dividing the order of the letter by 13 will obtain the value of the specific bit, while the remainder determines the value of the memory unit. The size of the memory unit is 4 bits.

According to the method of the present invention, resetting the specific bit refers to the writing in of "0", and setting the specific bit refers to the writing in of "1".

According to the method of the present invention, 16 specific bits and 16 memory units form a 10-byte memory space, in which 1 byte equals to 8 bits, and the 10-byte memory space may contain 16 letters at most.

The above-mentioned memory unit and read/write memories are well known in the art and are therefor not discussed in detail herein.

BRIEF DESCRIPTION OF THE DRAWINGS

FIG. 1 shows the data structure of a conventional caller identification code.

DETAILED DESCRIPTION OF THE PREFERRED EMBODIMENT

Figure 2:
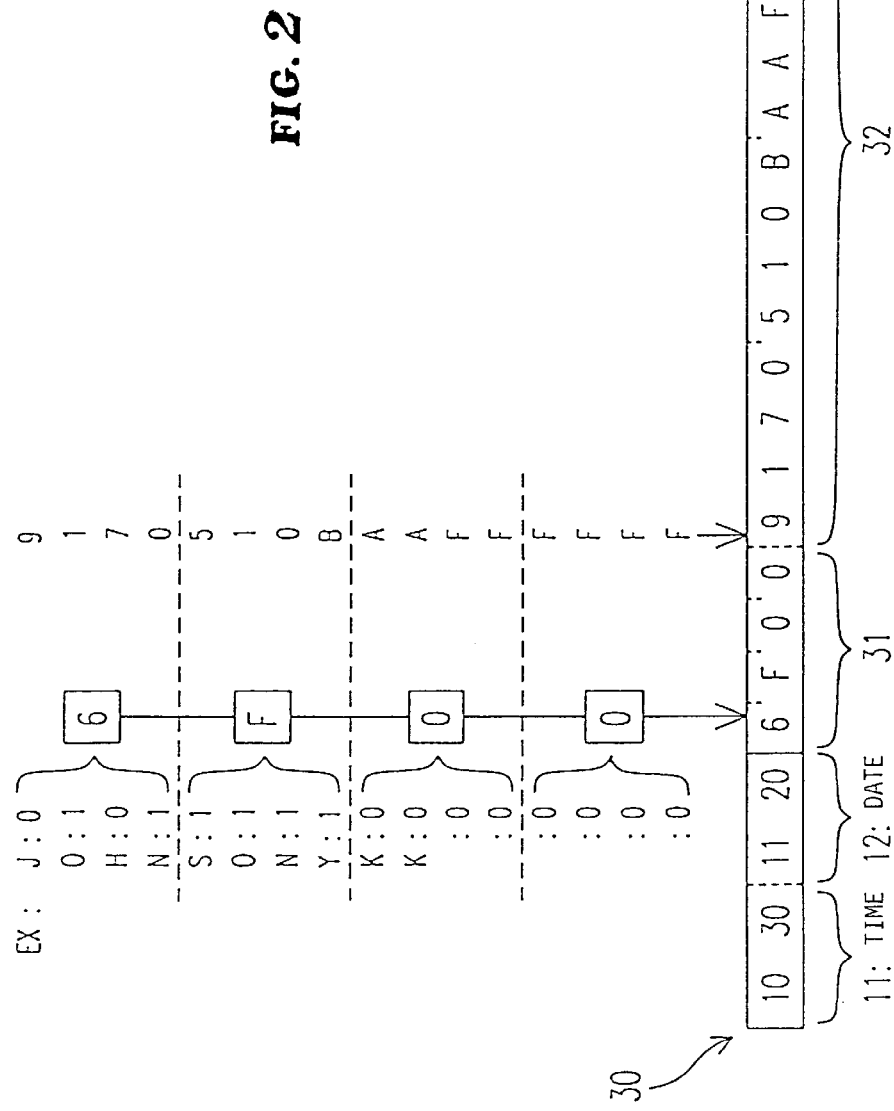
FIG. 2 shows a preferred embodiment of the data structure of the caller identification code of the present invention.

Referring to FIG. 2, as mentioned above, 5 bits will be enough to encode the letters of a name in a caller identification code 30. But if the encoding completely follows the order of the letters, it will be more complicated in processing. The present invention provides a method of 5-bit encoding which will not be complicated in processing, as shown in the header/tailer comparison table. The first half of the alphabet is given a header "0", while the second half thereof is given a tailer "1". The tailers from A–M are respectively encoded from "0" to "C" of the hexadecimal number system. Likewise, the tailers from "N" to "Z" are also from "0" to "C". In order to match the above-mentioned encoding method, the present invention provides a data structure 20 for accessing the letters of names in the caller identification code. As the time and date data in the first and second parts respectively are BCD codes, alteration is not necessary. The difference is that the present invention provides a header portion 31 of 16 specific bits to respectively store headers of 16 letters. At the same time, there are 16 memory units each of 4 bits, for representing 16 codes at most to represent one half of the alphabet, i.e., 13 letters (A–M or N–Z). In other words, when the central processing unit writes a letter of a name part of the caller identification code into the memory, it must first judge whether this letter is one of the first 13 letters or the second 13 letters. If it is one of the first 13 letters, "0" will be written into a specific bit, and the order (0–12) of that letter is written into the memory unit. The memory unit is a 4-bit one, plus the specific bit, there are altogether 5 bits. Using 5 bits to store the letters may reduce memory spaces.

When writing in data, the ASCII code of "A" (21 in a hexadecimal number system, and 33 in a decimal number system) may be subtracted from the ASCII code of the input letters. For instance, when "A" is being input, the ASCII code of "A" itself is subtracted by itself, and the order is 0. Take another example. Subtracting the ASCII code of "A" (33 in a decimal number system) from the ASCII code of "Z" (58 in the decimal number system), the difference is 25, which is the order of the letter. The order 25 is then divided by 13, and the quotient obtained is the header, the remainder being the tailer. For example, when the order of "A", i.e., 0, is divided by 13, a header 0 and a tailer 0 will be obtained. And if the order of "Z", i.e., 25, is divided by 13, a header 1 and a tailer 12 (C in a hexadecimal number system) will be obtained. Certainly, subtraction may be used in place of division. The principles are the same.

When reading the data, the data of the header portion 31 and the tailer portion 32 may be read one by one. At every reading of a header and a tailer, the header is multiplied by 13, plus the tailer and the ASCII code of "A". The ASCII code of the original letters may be recovered.

In FIG. 2, in order to better illustrate the principles of the present invention, "JOHNSONYKK" is used as an example. From the header/tailer comparison table, it can be seen that the header is 01011111100", and the tailer is "9170510BAA (in a hexadecimal number system). Since this embodiment uses the storage of 16 letters as an example, "0" and "F" of the hexadecimal number system are respectively added to the headers and tailers which do not have 16 letters. Therefore, the data actually stored in the memory read "6F00" for the header portion 31, and "9170510BAAFFFFFF" for the tailer portion 32. The reason why "F" instead of "0" is added to the tailer is that, if "0" is added thereto, then the central processing unit may misread it as the letter "A". In order to avoid misreading, "F" of the hexadecimal number system is used, not "0".

As a matter of fact, the present invention may be applied in the storage of 8 letters, 24 letters, and 32 letters. When adapted for use in the storage of 8 letters, only 5 bytes will be needed. For storage of 24 letters, 15 bytes are needed. For storage of 32 letters, 20 bytes are needed, so forth and so forth. It can therefore be seen that, compared to the prior art in which one byte stores one letter, the present invention may compress memory spaces by ⅝.

In application, the present invention uses the commonly used letters {A, B, . . . Z} as a sign set, and takes one half of it for encoding purposes. Certainly, other signs or symbols may also be used depending on actual requirements, or in combination with other commonly used signs. In the present embodiment, six signs may be compiled.

The above-mentioned mathematical calculation may be achieved by an algorithm unit (ALU) of the central processing unit. As the central processing unit is well known in the art, it will not be described in detail herein. From the above description and with reference to the drawings, it can be appreciated that the special design of encoding and data structure allows the memory space of the name part of a caller identification code to be reduced by ⅝. In other words, the same memory space can be used to store more caller identification codes.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

We claim:

1. A method of compressing letters adapted to store a letter which is included in a sign set, comprising the steps of:
   when the order of the letter exceeds a mean value of the sign set, setting a specific bit and setting the value of a memory unit as the order of the letter exceeding the mean value of the sign set; and
   when the order of the letter does not exceed the mean value of the sign set, resetting the specific bit and setting the value of the memory unit as the order of the letter;
   wherein the value of the memory unit is determined by the number of half of the letters in the sign set.

2. The method as claimed in claim 1, wherein the sign set includes {A, B . . . Y,Z} spaces and 26 letters, and the mean value of the sign set is {M}, that which of the order of the letter not exceeding the mean value of the sign set being {A,B . . . , M}, and that which of the order of the letter exceeding the mean value of the sign set being {N,O, . . . , Z}.

3. The method as claimed in claim 2, wherein the order of the letter is from 0 of {A}, 1 of {B}, . . . , to 25 of {Z}, and dividing the order of the letter by 13 will obtain the value of the specific bit, while the remainder determines the value of the memory unit.

4. The method as claimed in claim 3, wherein the size of the memory unit is 4 bits.

5. The method as claimed in claim 4, wherein resetting the specific bit refers to the writing in of "0", and setting the specific bit refers to the writing in of "1".

6. The method as claimed in claim 4, wherein 16 specific bits and 16 memory units form a 10-byte memory space, in which 1 byte equals to 8 bits, and the 10-byte memory space may contain 16 letters at most.

* * * * *